(12) United States Patent
Fukuzaki (10) Patent No.: US 10,181,436 B2
(45) Date of Patent: Jan. 15, 2019

(54) LEAD FRAME AND METHOD OF MANUFACTURING THE SAME

(71) Applicant: SH MATERIALS CO., LTD., Tokyo (JP)

(72) Inventor: Jun Fukuzaki, Kagoshima (JP)

(73) Assignee: SH MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/848,550

(22) Filed: Dec. 20, 2017

(65) Prior Publication Data

US 2018/0197810 A1    Jul. 12, 2018

(30) Foreign Application Priority Data

Jan. 12, 2017  (JP) ................. 2017-003247

(51) Int. Cl.
*H01L 23/495* (2006.01)
*H01L 21/48* (2006.01)
*H01L 23/00* (2006.01)

(52) U.S. Cl.
CPC .... *H01L 23/49582* (2013.01); *H01L 21/4821* (2013.01); *H01L 21/4828* (2013.01); *H01L 23/49517* (2013.01); *H01L 23/49534* (2013.01); *H01L 23/49541* (2013.01); *H01L 24/30* (2013.01); *H01L 2224/05644* (2013.01); *H01L 2224/05655* (2013.01); *H01L 2224/05664* (2013.01)

(58) Field of Classification Search
CPC ......... H01L 23/49582; H01L 23/49541; H01L 21/4821; H01L 23/49534; H01L 21/4828; H01L 23/49517; H01L 24/30; H01L 2224/05664; H01L 2224/05655; H01L 2224/05644
USPC ......................... 257/666, 670, 672
See application file for complete search history.

(56) References Cited

U.S. PATENT DOCUMENTS

| | | | | |
|---|---|---|---|---|
| 5,326,990 | A * | 7/1994 | Mita | H01L 23/49531 257/672 |
| 6,593,643 | B1 * | 7/2003 | Seki | H01L 23/49582 257/677 |
| 2003/0082398 | A1 * | 5/2003 | Tanaka | B32B 15/01 428/647 |
| 2008/0116546 | A1 * | 5/2008 | Bang | H01L 23/3107 257/666 |

FOREIGN PATENT DOCUMENTS

JP    H11-345895    12/1999

* cited by examiner

*Primary Examiner* — Selim Ahmed
(74) *Attorney, Agent, or Firm* — IPUSA, PLLC

(57) ABSTRACT

A lead frame includes leads including inner leads and outer leads. Each of the leads includes an inner lead and an outer lead. A tie bar extends so as to cross connecting points of the inner leads and the outer leads. The leads and the tie bar include a first surface, a second surface, and side surfaces. A plating layer is provided on the inner leads, the outer leads and the tie bar. A first non-plating region is provided between an edge in the first surface of the inner lead and an edge of the plating layer provided on the first surface of the inner lead. A second non-plating region is provided between an edge of the first surface on the inner lead side of the tie bar and an edge on the inner lead side of the plating layer provided on the first surface of the tie bar.

6 Claims, 7 Drawing Sheets

CROSS-SECTIONAL VIEW A-A

FIG.2B

CROSS-SECTIONAL VIEW B-B

FIG.2C

CROSS-SECTIONAL VIEW C-C

LEAD FRAME AND METHOD OF MANUFACTURING THE SAME

CROSS-REFERENCE TO RELATED APPLICATIONS

This patent application is based upon and claims priority to Japanese Patent Application No. 2017-3247, filed on Jan. 12, 2017, the entire contents of which are incorporated herein by reference.

BACKGROUND OF THE INVENTION

1. Field of the Invention

The present invention relates to a lead frame and a method of manufacturing the same.

2. Description of the Related Art

Conventionally, a lead frame is manufactured by forming a metal plate into a predetermined shape by performing an etching process and press working on the metal plate and then depositing a necessary plating layer on the metal plate.

In lead frame manufacture performing an etching process on a metal plate, for example, a resist mask for etching is formed by attaching dry film resist to both sides of the metal plate, exposing the dry film resist using a mask with a predetermined pattern and developing the dry film resist. Then, the metal plate is formed into a predetermined lead frame shape by etching. After that, the resist mask for etching formed on both sides of the metal plate is removed, and a desired plating process is performed on the lead-frame-shaped metal plate.

Specifications of the desired plating processes include a variety of processing forms such as a lead frame having a plating layer on its entire surfaces (top surface, back surface and side surface), a lead frame partially having a plating layer, a lead frame having a plating layer only on its top surface, and a lead frame having different plating layers on its top surface and back surface from each other.

When partially forming the plating layer on the metal plate, conventionally, a method is adopted of forming a plating layer only on a necessary portion by covering the other portion on which the plating layer is not to be formed with a rubber material while using a plating jig. However, in recent years, because the lead frame has come to be formed into a fine shape, it has become difficult to produce the plating jig. Thus, a method has come to be adopted of forming a plating mask using resist, and removing the resist mask after the plating process.

When forming the lead frame via the etching process for a metal plate, in general, a resist mask for etching is formed on the metal plate, and the resist mask for etching is removed after etching the metal plate. Other than the case of forming the same plating layer on the entire surface of the lead frame, a resist mask for plating is formed on the metal plate, and the resist mask for plating is removed after the plating process. Thus, in the general lead frame manufacture, the resist mask for etching and the resist mask for plating have been separately formed and removed from each other for different processes (etching process and plating process).

In the meantime, a variety of lead frame plating process specifications is present as discussed above, and one of the plating process specifications is a combination plating form that partially forms a plating layer on tip regions of inner leads, and entirely forms a plating layer on outer leads.

Figure 8:
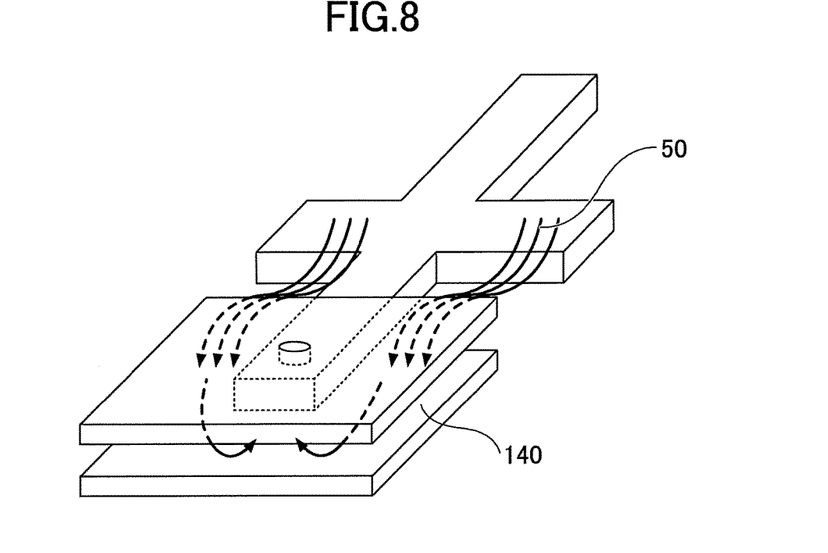
FIG. 8 is a diagram showing a conventional plating process.
Figure 9:
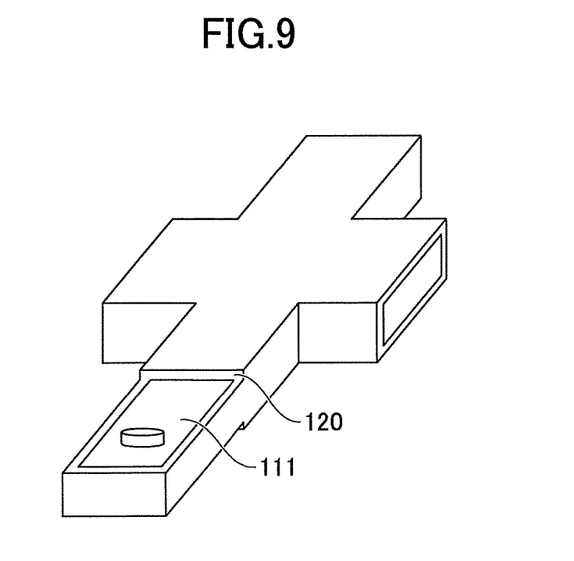
FIG. 9 is a diagram showing a plating layer of an example of the conventional plating process.

FIG. 8 is a diagram illustrating a conventional plating process for performing such a form of plating process. FIG. 9 is a diagram illustrating a plating layer formed by the conventional plating process. In the manufacturing process of the above-mentioned lead frame that has the partial plating on the tip regions of the inner leads and the entire plating on the entire surface of the outer leads, when using a method of forming and removing different resist masks for different processes independently, as illustrated in FIG. 8, a plating solution 50 flows into a gap between resist masks formed on atop surface and aback surface of a lead frame during the plating, and as illustrated in FIG. 9, the adhesion of a plating layer 120 on side surfaces of an inner lead 111 cannot be prevented.

In the meantime, conventionally, Japanese Laid-Open Patent Application Publication No. 11-345895 discloses a lead frame manufacturing method that uses a single mask for different processes.

In the lead frame manufacturing method disclosed in Japanese Laid-Open Patent Application Publication No. 11-345895, resist masks for plating made of different materials are each formed on a top surface and a back surface of a metal plate, and only the resist mask on the top surface is dissolved and removed after depositing a necessary plating layer. Then, an etching process is performed on an exposed portion of the metal plate using the already deposited plating layer as a resist mask for etching, thereby forming the metal plate into a lead frame shape.

Moreover, in the technique disclosed in Japanese Laid-Open Patent Application Publication No. 11-345895, by using the undissolved and unremoved resist mask on the back surface not only as the mask for plating but also as the mask for etching, and using the plating layers formed on both sides of the top and back surfaces as an etching mask, the number of times of forming the resist masks is reduced.

However, the technique disclosed in Japanese Laid-Open Patent Application Publication No. 11-345895 in which the resist masks for plating made of different materials are formed on both side of the metal plate; the resist mask remaining on the back surface without being dissolved and removed is also used as the etching mask; and the plating layers on both sides are used as the etching mask, has a problem of easily forming the unevenness in the surfaces of the plating layers because the plating layer is influenced by the etchant.

Moreover, because plating layers are formed only at locations to be used as terminals, and thus because the plating locations cannot be selectively set at any locations on the top and back surfaces and side surfaces of inner leads, outer leads and the like, desired plating characteristics cannot be obtained.

SUMMARY OF THE INVENTION

Accordingly, embodiments of the present invention aim to provide a lead frame and a method of manufacturing the lead frame that can reduce a cost by reducing the number of forming resist masks and simplifying a process in lead frame manufacture that performs different plating process specifications on a top surface and a back surface of an inner lead or an outer lead from each other, such as a configuration of a plating layer, and presence and absence of a plating layer.

According to one embodiment of the present disclosure, there is provided a lead frame that includes a plurality of leads including inner leads and outer leads. Each of the plurality of leads includes an inner lead and an outer lead that continuously extend. A tie bar extends so as to cross connecting points of the inner leads and the outer leads. The leads and the tie bar include a first surface, a second surface opposite to the first surface, and side surfaces provided between the first surface and the second surface. A plating layer is partially and continuously provided on the inner lead, the outer lead and the tie bar. A first non-plating region is provided between an edge in the first surface of the inner lead and an edge of the plating layer provided on the first surface of the inner lead such that the first surface of the inner lead is exposed. A second non-plating region is provided between an edge of the first surface on the inner lead side of the tie bar and an edge on the inner lead side of the plating layer provided on the first surface of the tie bar such that the first surface on the inner lead side of the tie bar is exposed.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are simply illustrative examples and are not restrictive of the invention as claimed.

DETAILED DESCRIPTION OF THE PREFERRED EMBODIMENTS

The embodiments of the present disclosure are described below with reference to the accompanying drawings.

Figure 1A:
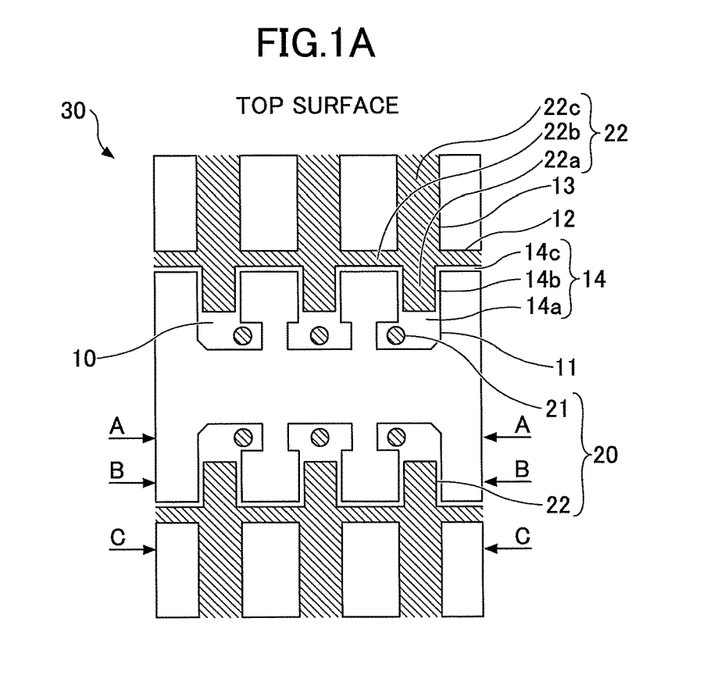
FIGS. 1A and 1B are diagrams illustrating an example of a lead frame according to an embodiment of the present disclosure.
Figure 1B:
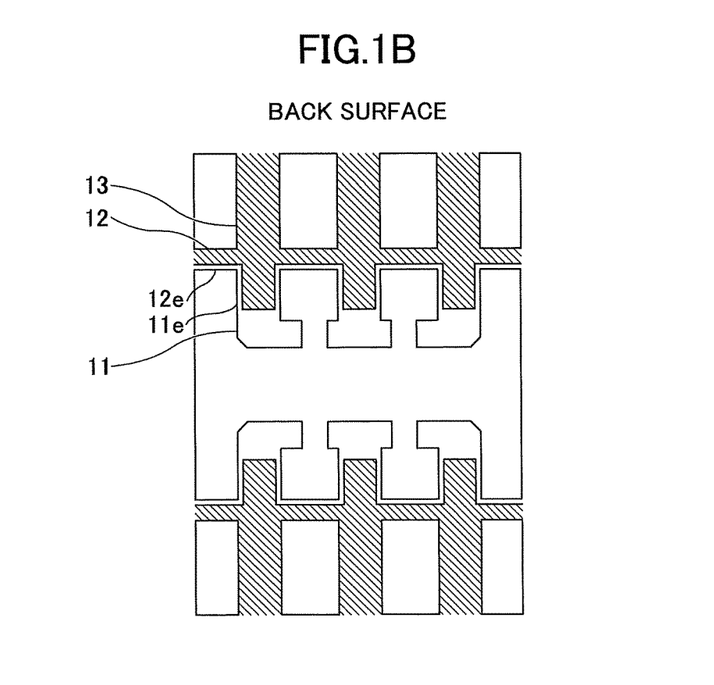

FIGS. 1A and 1B are diagrams illustrating an example of a lead frame according to an embodiment of the present disclosure. FIG. 1A is a diagram illustrating a top surface of the lead frame according to the embodiment of the present disclosure. FIG. 1B is a diagram illustrating a back surface of the lead frame according to the embodiment of the present disclosure. Here, the top surface means a surface on which a semiconductor device is mounted, and the back surface means a surface on which a semiconductor device is not mounted.

As illustrated in FIGS. 1A and 1B, a lead frame 30 is formed by shaping a metal plate 10 into a predetermined lead frame shape. The metal plate 10 is, for example, formed into a lead frame shape that includes inner leads 11, tie bars 12, and outer leads 13. Each of the inner leads 11 and outer leads 13 continuously extends and forms the entire lead. Moreover, the lead frame 30 is configured by forming a plating layer 20 on the metal plate 10 formed into the lead frame shape. The plating layers 20 include inner lead tip plating layers 21 that are formed on the tip of the inner leads 11, and continuous plating layers 22 that are formed on the inner leads 11, the tie bars 12 and the outer leads 13 while continuously extending thereon. Furthermore, the lead frame 30 includes a non-plating region 14 that has an exposed surface of the metal plate 10 on which the plating layer 20 is not formed.

The metal plate 10 is made of a metallic material and serves as a base material or a substrate. The metal plate 10 can be selected from a variety of metallic plates depending on the intended use, and for example, may be made of a copper-containing material such as copper material and a copper alloy. Because copper has high conductivity and is relatively less expensive, copper is generally used as a lead frame material.

The metal plate 10 may have a variety of thicknesses depending on the intended use, and for example, a metal plate 10 having a thickness of 0.1 to 0.2 mm may be used. More specifically, for example, a metal plate 10 having a thickness of 0.15 mm may be used.

The metal plate 10 has a continuous plate-like shape (e.g., band-like shape) before being processed, and is formed into a shape having the inner leads 11, the tie bars 12, and the outer leads 13 by removing unnecessary portions from the metal plate 10 via an etching process.

The inner lead 11 is a lead provided on the inner side, and forms a portion to which an electrode of a mounted semiconductor device is directly connected. In FIGS. 1A and 1B, the portions inside the tie bars 12 correspond to the inner leads 11. Inner terminals are formed on the tip regions of the inner leads 11 as the plating layers 20 to electrically connect the electrodes of the mounted semiconductor device with the inner leads 11. In FIG. 1A, the inner lead tip plating layers 21 correspond to the inner terminals. When connecting the electrodes of the semiconductor device with the inner terminals on the inner leads 11, there is a case of mounting the semiconductor device so that the electrodes of the semiconductor device are arranged on the top surface of the semiconductor device and connecting the electrodes with the inner leads 11 by wire bonding using wires. Also there is a case of mounting the semiconductor device so that a surface with the electrodes of the semiconductor device is directly placed on the inner leads 11 and directly connecting the electrodes with the inner terminals by flip chip bonding. In FIG. 1A, an example of the flip chip bonding is illustrated. In the case of wire bonding, for example, a die pad and the like on which the semiconductor device is mounted, only have to be provided between the inner leads 11 facing each other such that the semiconductor device can be mounted on the die pad. Here, the die pad can be formed by performing the etching process on the metal plate 10.

Moreover, the planar shape of the inner tip plating layers 21 may be a quadrilateral such as a square or a rectangle in addition to the circle as illustrated in FIG. 1A. Furthermore, the dimension of the inner lead tip plating layers 21 may be determined depending on the intended use, and for example, may be determined to have a diameter or a diagonal line in a rage of 0.05 to 0.2 mm. In addition, the inner lead tip plating layers 21 are preferably provided apart from edges on both sides of the inner leads 11, and for example, may be provided at a distance of 0.03 mm or more from the both edges of the inner leads 11.

The outer leads 13 are provided outside the inner leads 11, and are formed so as to continuously extend outward from the inner leads 11. Thus, the electrical connection with the electrodes of the semiconductor device can be drawn outward. In FIGS. 1A and 1B, portions outside the tie bars 12 correspond to the outer leads 13.

The tie bars 12 are provided at connecting points of the inner leads 11 and the outer leads 13. The tie bars 12 serve as supports to leave the inner leads 11 and the outer leads 13 to be connected to an outer frame when forming the lead frame 30 by cutting out the shape from a large metal plate 10. Although the tie bars 12 are finally removed when a semiconductor package is formed, the tie bars 12 are provided to support the inner leads 11 and the outer leads 13 in a state of the lead frame 30. Thus, the tie bars 12 form connecting points by crossing over the inner leads 11 and the outer leads 13, and are provided so as to cross the plurality of inner leads 11 and outer leads 13.

Here, in FIGS. 1A and 1B, only three inner leads 11 and outer leads 13 are illustrated, but in fact, many leads are formed by including many inner leads 11 and outer leads 13 radially extending from a central portion. In FIGS. 1A and 1B, three of the inner leads 11 and the outer leads 13 are enlarged and illustrated.

As discussed above, the inner lead tip plating layers 21 are the inner terminals that are connected to the electrodes of the semiconductor device mounted on the lead frame 30, and are provided only on the tip regions on the top surface of the inner lead frames 11. As illustrated in FIG. 1B, because the semiconductor device is not mounted on the back surface of the lead frame 30, the lead frame tip plating layers 21 are not provided on the back surface of the lead frame 30.

Continuous plating layers 22 that continuously extend on the lead frame 30 are provided on part of the inner leads 11 and on the top and back surfaces of the tie bars 12 and the outer leads 13. The continuous plating layers 22 include continuous plating layers 22a formed on the inner leads 11, continuous plating layers 22b formed on the tie bars 12, and continuous plating layers 22c formed on the outer leads 13.

The continuous plating layers 22a formed on the inner leads do not reach the tips of the inner leads 11, and non-plating regions 14a (third non-plating regions) are formed in the tip regions of the inner leads 11. Moreover, non-plating regions 14b are formed between the edges on both sides of the continuous plating layers 22a and the edges 11e on both sides of the inner leads 11. Furthermore, non-plating regions 14c (second non-plating regions) are also formed between the edges 12e on the inner leads 11 side of the tie bars 12 and the edges on the inner leads 11 side of the continuous plating layers 22b. The non-plating regions 14a, 14b and 14c are continuously formed and constitute a single non-plating region 14.

Thus, in the inner leads 11, exposed surfaces are provided in the tip regions and the edges of the inner leads 11 (metal plate 10) on both sides of the top and back surfaces. Forming the continuous plating layers 22a having such a shape can prevent the continuous plating layers 22a from covering the side surfaces of the inner leads 11 in the plating process. The shape of the continuous plating layers 22a having the non-plating regions 14 in the tip regions and the edges is formed by forming a resist mask that covers both edges of the inner leads 11 along a lengthwise direction and the edge on the inner leads 11 side of the tie bars 12 so as to extend along the edges, and that covers the tip regions of the inner leads 11 so as to cross a width direction of the inner leads 11 and to connect both edges of the inner leads 11, and by plating the lead frame 30 covered by the resist mask. The resist masks formed to cover the edges of the inner leads 11 and the tie bars 12 by extending along the edges of the inner leads 11 and the tie bars 12 and to cover the tip regions of the inner leads 11 continuously serve as shielding plates to prevent an inflow of plating solution, and can prevent the inflow of the plating solution from above and below (from the top surface and the back surface) of the inner leads 11 (see FIG. 6). Details of the method for manufacturing the lead frame 30 are described below.

Figure 2A:
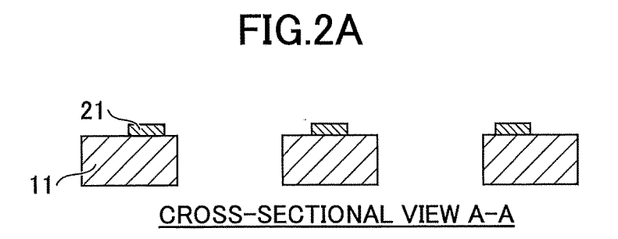
FIGS. 2A through 2C are cross-sectional views illustrating an example of the lead frame illustrated in FIGS. 1A and 1B.
Figure 2B:
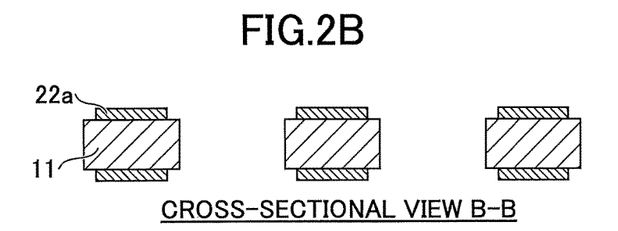
Figure 2C:
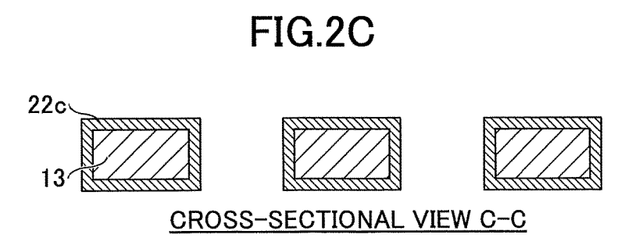

FIGS. 2A through 2C are cross-sectional views of the lead frame 30 illustrated in FIGS. 1A and 1B. FIG. 2A is a cross-sectional view of the inner lead 11 taken along an A-A line in FIG. 1A. FIG. 2B is a cross-sectional view of the inner lead 11 taken along a B-B line in FIG. 1A. FIG. 2C is a cross-sectional view of the outer lead 13 taken along a C-C line in FIG. 1A.

As illustrated in FIGS. 2A and 2B, the side surfaces of the inner leads 11 are not covered with the plating layer 20. More specifically, as illustrated in FIG. 2A, in the A-A cross section of each of the tip regions of the inner leads 11, only the inner lead tip plating layer 21 is provided on the top surface of the inner lead 11, and any plating layer 20 is not provided on the other surfaces. Moreover, as illustrated in FIG. 2B, in the B-B cross section of each of the base regions of the inner leads 11, the continuous plating layers 22a are formed on the top surface and the back surface of each of the inner leads 11, but the continuous plating layer 22 are not formed on the side surfaces.

In contrast, as illustrated in FIG. 2C, with respect to the outer leads 13, the entire surfaces including not only the top surface and the back surface, but also the side surfaces, are covered with the continuous plating layers 22c. Thus, in the lead frame 30 according to the present embodiment, the plating layers 21 and 22a are selectively formed on the inner leads 11, whereas the plating layers 22c are formed on the entire surfaces of the outer leads 13.

Such a configuration can prevent bleeding of solder, that is, an outflow of the solder, when mounting a semiconductor device on the inner leads 11. Thus, a short circuit between electrodes of the semiconductor device, which has a very short distance from each other, and a short circuit between the adjacent inner leads 11 can be prevented.

Furthermore, in the outer leads 13, by providing the continuous plating layers 22c that have preferable wettability on the entire surfaces, bonding strength to a substrate can be ensured. In addition, in the side surfaces, a wetting and spreading state of solder for substrate bonding, which means a shape of the solder, can be visually recognized, and a visual inspection in the substrate bonding process can be readily performed. This makes it possible to perform an automatic inspection by image recognition.

In the tie bars 12, the non-plating regions 14c are provided on the inner leads 11 side, and the top surfaces, the side surfaces and the back surfaces of the outer leads 13 are continuously plated so as to be covered with the continuous plating layers 22b.

Here, although the non-plating regions 14a, 14b and 14c can be made a variety of dimensions depending on the intended use, the dimensions of the non-plating regions 14b between the edges 11e of the inner leads 11 and the edges of the continuous plating layers 22a, and the non-plating regions 14c between the edges 12e of tie bars 12 on the inner leads 11 side and the edges of the continuous plating layers 22b may be set, for example, in a range of 0.03 mm to 0.1 mm. As illustrated in FIGS. 1A and 1B, although the non-plating regions 14a are large regions, the non-plating regions 14b and 14c are narrow regions along both edges of the inner leads 11 and the edge on the inner leads 11 side of the tie bars 12, setting an appropriate width such that the solder does not flow in the edge side is preferable to prevent the solder bleeding when mounting the semiconductor device.

Next, the method of manufacturing the lead frame according an embodiment of the present disclosure is described below.

Figure 3A:
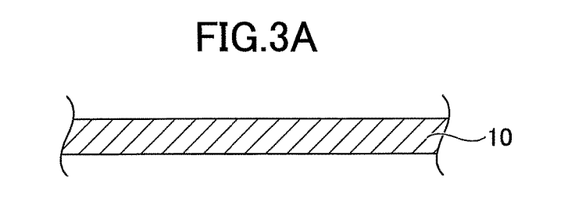
FIGS. 3A through 3C are diagrams illustrating an example of a first stage of a series of processes of a method of manufacturing a lead frame according to an embodiment of the present disclosure.

FIGS. 3A through 5C are diagrams illustrating a series of processes of the method of manufacturing the lead frame according to the embodiment of the present disclosure. FIGS. 3A through 3C are diagrams illustrating a first stage of an example of the method of manufacturing the lead frame 30 according to the embodiment of the present disclosure.

FIG. 3A is an example of a metal material preparing process. In the metal material preparing process, a metal plate 10 is prepared. As discussed above, with respect to the metal plate 10, for example, the metal plate 10 made of copper material and having a thickness of 0.15 mm may be prepared.

Figure 3B:
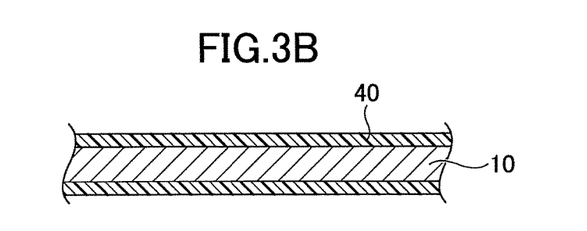

FIG. 3B is a diagram illustrating an example of a first dry film resist laminate process. In the first dry film resist laminate process, dry film resist 40 is laminated on both sides of the metal plate 10.

Figure 3C:
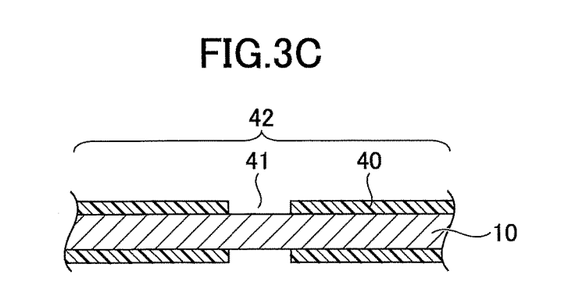

FIG. 3C is a diagram illustrating an example of an etching mask formation process. In the etching mask formation process, exposure is performed to form an opening 41 at an etching location of the dry resist film 40, and an unnecessary portion of the dry film resist 40 is removed by development, thereby forming the opening 41. Thus, the etching masks 42 are formed.

Figure 4A:
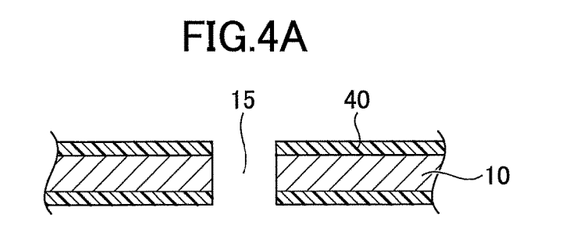
FIGS. 4A through 4C are diagrams illustrating an example of a second stage of a series of processes of the method of manufacturing the lead frame according to the embodiment of the resent disclosure.
Figure 4B:
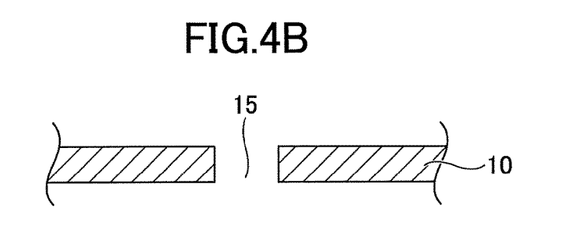
Figure 4C:
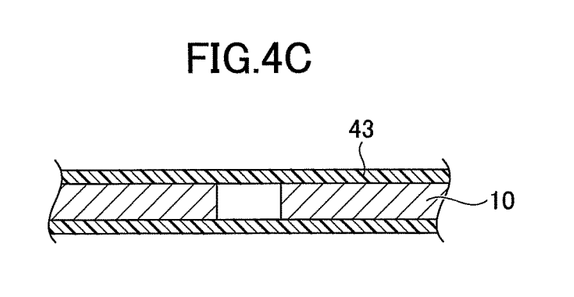

FIGS. 4A through 4C are diagrams illustrating intermediate processes of an example of the method of manufacturing the lead frame according to the embodiment of the present disclosure.

FIG. 4A is a diagram illustrating an example of an etching process. In the etching process, an etching liquid is supplied to the metal plate 10, and an etching process is performed on the metal plate 10 corresponding to the opening 41 of the etching masks 42, and the portion of the metal plate 10 corresponding to the opening 41 is removed. Thus, an opening 15 is formed in the metal plate 10.

FIG. 4B is a diagram illustrating an example of a first resist stripping process. In the first resist stripping process, the dry film resist 40 is removed from the metal plate 10 by using a predetermined stripping agent.

FIG. 4C is a diagram illustrating an example of a second dry film resist laminate process. In the second dry film laminate process, dry film resist 43 is laminated on both sides of the metal plate 10 having the opening 15. Here, the dry film resist 43 may be the same as the dry film resist 40 used in the first dry film resist laminate process, or may be different from the dry film resist 40 used in the first dry film resist laminate process.

Figure 5A:
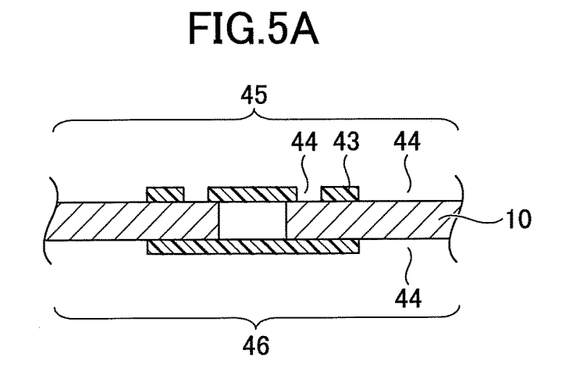
FIGS. 5A through 5C are diagrams illustrating an example of third stage of a series of processes of the method of manufacturing the lead frame according to the embodiment of the present disclosure.
Figure 5B:
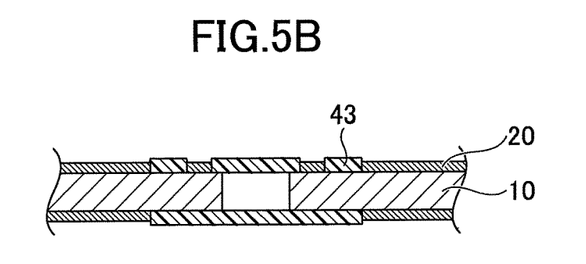
Figure 5C:
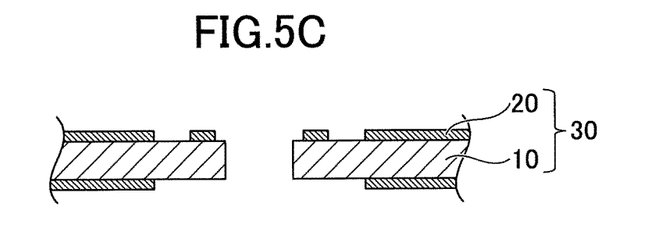

FIGS. 5A through 5C are diagrams illustrating the last processes of an example of the method of manufacturing the lead frame according to the embodiment of the present disclosure.

FIG. 5A is a diagram illustrating an example of a plating mask forming process. In the plating mask forming process, exposure is performed to form openings 44 at locations to be etched of the dry resist film 43, and unnecessary portions of the dry resist film 43 are removed by development, thereby forming the openings 44. Thus, plating masks 45 and 46 are formed.

FIG. 5B is a diagram illustrating an example of a plating process. In the plating process, plating layers 20 are formed in the openings 44 of the plating masks 45 and 46. The plating layers 20 may be formed as a mono plating layer or a plurality of stacked layers such as Ni/Pd/Au layers. A variety of plating materials is available for the plating layers 20 depending on the intended use. Moreover, a variety of shapes of plating layers 20 can be formed in accordance with the specification of the plating process.

FIG. 5C is a diagram illustrating an example of a second resist stripping process. In the second resist stripping process, the dry film resist 43 is stripped and removed from the metal plate 10 by using a predetermined remover and the like. Thus, the lead frame 30 is completed.

Figure 6:
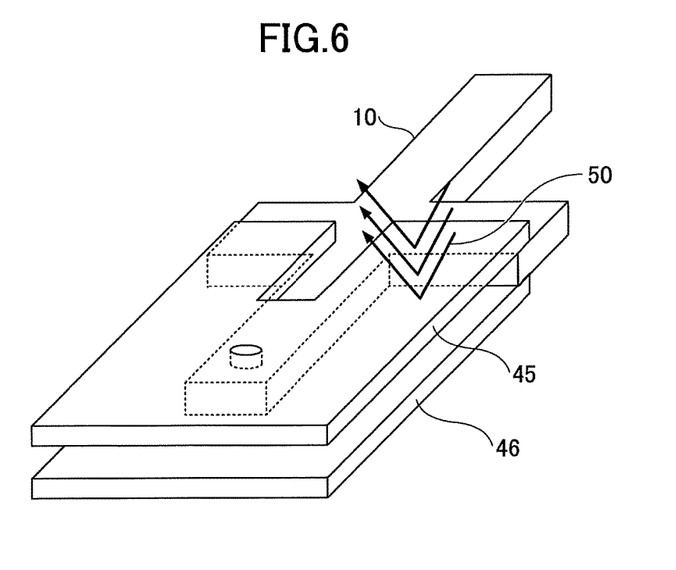
FIG. 6 is a diagram for explaining a plating process of an example of a method of manufacturing a lead frame according to an embodiment of the present disclosure.

Next, the plating process illustrated in FIG. 5C is described in more detail with reference to FIG. 6. FIG. 6 is a diagram for explaining a plating process of an example of the method of manufacturing the lead frame according to an embodiment of the present disclosure.

As illustrated in FIG. 6, in order to manufacture the lead frame 30 as illustrated in FIGS. 1A through 2C, the shape of the plating masks 45 and 46 has to be formed into a shape that covers the entire top end portion of the inner leads 11 and both edges of the base portion and the edge portion on the inner leads 11 side of the tie bars 12. Thus, when covering the edge portions from the inner leads 11 to the tie bars 12 along the edges thereof, a space surrounded by the side surfaces of the inner leads 11, the side surfaces of the tie bars 12 and the plating masks 45 and 46 from both sides (top and bottom) becomes an enclosed space, and the inflow of the plating solution 50 into the space can be prevented. Hence, the formation of the plating layers 20 on the side surfaces of the inner leads 11 and the side surfaces on the inner leads 11 sides of the tie bars 12 can be prevented. Here, as illustrated in FIG. 6, because the side surfaces of the plating masks 45 and 46 are not closed, the space surrounded by the plating masks 45 and 46 cannot be formed as a completely enclosed space, but the space forms an enclosed space at least in the vertical direction (thickness direction of the metal plate 10). In other words, the plating masks 45 and 46 serve as shielding plates to prevent the inflow of the plating solution 50 to the side surfaces of the inner leads 11 and the tie bars 12 from above and below.

Figure 7:
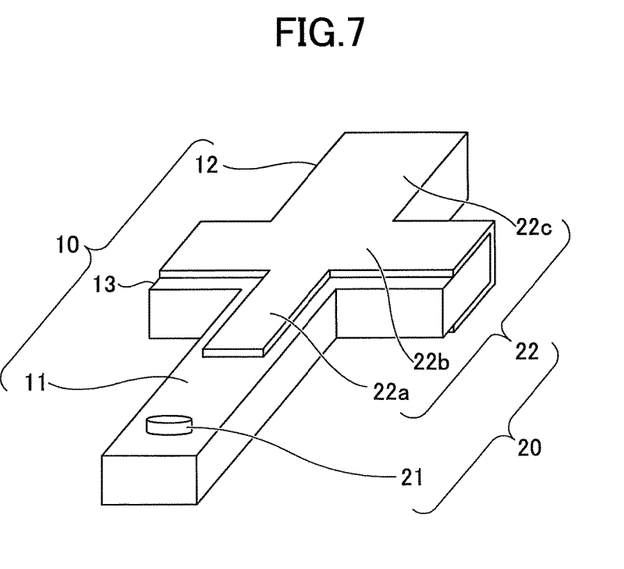
FIG. 7 is a diagram for explaining an example of a plating layer formed after the plating process illustrated in FIG. 6.

FIG. 7 is a diagram illustrating a plating layer 20 formed after the plating process illustrated in FIG. 6. As illustrated in FIG. 7, the plating layer 20 is not formed in the side surfaces of the inner lead 11 and the tie bar 12. On the other hand, the inner lead tip plating layer 21 is formed on the top surface of the inner lead 11; the continuous plating layers 22a and 22b are formed on the top surface and the back surface of the inner lead and the tie bar 12; and the continuous plating layer 22ac is formed on the entire surface of the outer leads 12.

Thus, according to the method of manufacturing the lead frame according to the embodiment of the present disclosure, by performing the plating process using the plating masks 45 and 46 covering the edges of the inner leads 11 and the tie bars 12, the lead frame 30 that does not have the plating layer 20 on the side surfaces of the inner leads 11 can be achieved by simple processes.

WORKING EXAMPLES

Next, working examples of the method of manufacturing the lead frame of the present disclosure are described below. Here, a description of a pretreatment and a posttreatment and the like including chemical cleaning and water cleaning performed in each process in the course of manufacture of the working examples is omitted for the convenience of explanation because the pretreatment and the posttreatment are well-known processes.

Working Example 1

To begin with, a 0.15 mm-thick copper material was used as a metal plate that served as a base material of a lead frame. Resist layers were formed on a top surface on which a semiconductor device was to be mounted and a back surface of the metal plate, and a resist mask was formed by exposing and developing the resist layers using a glass mask having a pattern drawn for forming a predetermined lead frame shape.

Next, the predetermined lead frame shape was formed by performing an etching process on regions exposed from the resist mask of the metal plate.

Subsequently, the resist mask was removed.

Next, resist layers were formed on the top surface and the back surface of the metal plate, and a resist mask was formed by exposing and developing the resist layers using a glass mask having a pattern drawn for forming a plating layer having a predetermined shape. The range of the plating layer at this time was set up to base portions of outer leads and tie bars where the outer leads and the tie bars were connected to a peripheral portion of the lead frame (outer frame portion of the lead frame). The peripheral portion (frame portion) of the lead frame was set to an area where the plating layer was not formed, and the thickness of the targeted plating layer formed in a packaging area was intended to be thicker by utilizing characteristics of electroplating.

Here, the resist mask was formed so as to cover both edge portions of the inner leads and edge portions on the inner leads side of the tie bars. Thus, the both side surfaces of the lead frames, the side surfaces on the inner leads side of the tie bars, and the resist masks on both sides were able to form a closed space that prevented an inflow of a plating solution.

Next, a Ni plating layer having a setting thickness of 1.0 to 5.0 μm, a Pd plating layer having a setting thickness of 0.02 to 0.1 μm, and an Au plating layer having a setting thickness of 0.003 to 0.015 μm were formed on the top surface, the back surface and the side surfaces of the metal plate formed into the lead frame shape by electroplating in this order, thereby forming a three-layered plating layer formed by stacking the Ni/Pd Au layers from the bottom.

Next, the resist masks on the metal plate were removed. Thus, the lead frame as illustrated in FIG. 1 was obtained. The obtained lead frame had a plating layer formed on a surface on which a semiconductor device was to be mounted in each tip region of the inner leads in the desired order of Ni/Pd/Au from the bottom, and a plating layer formed on the top surfaces, the side surfaces, and the back surfaces of the outer leads to be connected to an external device, in the order of the Ni/Pd/Au layers from the bottom.

The plating layer was not formed on the side surfaces of the inner leads and the side surfaces on the inner leads side of the tie bars of the obtained lead frame.

Working Example 2

To begin with, a 0.15 mm-thick copper material was used as a metal plate that served as a base material of a lead frame. Resist layers were formed on a top surface on which a semiconductor device was to be mounted and a back surface of the metal plate, and a resist mask was formed by exposing and developing the resist layers using a glass mask having a pattern drawn for forming a predetermined lead frame shape.

Next, the predetermined lead frame shape was formed by performing an etching process on regions exposed from the resist mask of the metal plate.

Subsequently, the resist mask was removed.

Next, resist layers were formed on the top surface and the back surface of the metal plate, and a resist mask was formed by exposing and developing the resist layers using a glass mask having a pattern drawn for forming a plating layer having predetermined shape. With respect to the range of the plating layer at this time, the peripheral portion of the lead frame was plated on the entire surfaces (the top surface, the back surface and the side surfaces) of the metal plate, and the thickness of the targeted plating layer in a packaging area was intended to be thinner by utilizing characteristics of electroplating.

Here, the resist mask was formed so as to cover both edge portions of the inner leads and edge portions on the inner leads side of the tie bars. Thus, the both side surfaces of the lead frames, the side surfaces on the inner leads side of the tie bars, and the resist masks on both sides were able to form a closed space that prevented an inflow of a plating solution.

Next, a Ni plating layer having a setting thickness of 1.0 to 5.0 μm, a Pd plating layer having a setting thickness of 0.02 to 0.1 μm, and an Au plating layer having a setting thickness of 0.003 to 0.015 μm were formed on the top surface, the back surface and the side surfaces of the metal plate formed into the lead frame shape by electroplating in this order, thereby forming a three-layered plating layer formed by stacking the Ni/Pd Au layers from the bottom.

Next, the resist masks on the metal plate were removed. Thus, the lead frame as illustrated in FIG. 1 was obtained. The obtained lead frame had a plating layer formed on a surface on which a semiconductor device was to be mounted in each tip region of the inner leads in the desired order of Ni/Pd/Au from the bottom, and a plating layer formed on the top surfaces, the side surfaces, and the back surfaces of the outer leads to be connected to an external device, in the order of the Ni/Pd/Au layers from the bottom.

The plating layer was not formed on the side surfaces of the inner leads and the side surfaces on the inner leads side of the tie bars of the obtained lead frame.

Comparative Example 1

A plating layer is formed on side surfaces of the inner leads when forming the plating layer by a conventional plating process. Due to this, a process for removing the formed plating layer is further required. In the conventional plating process, when resist masks covering a top surface and a back surface shaped along the shape of the inner leads were formed so that side surfaces of the inner leads were exposed, and a plating process was performed, a plating layer was formed on the side surfaces of the inner leads. Hence, the plating layer on the side surfaces of the inner leads was required to be stripped through a plating layer stripping process, and then the resist masks were removed. Thus, the comparative example 1 required more process, thereby making the process more complicated.

As discussed above, according to the embodiments of the present disclosure, in a manufacture of a lead frame having a different plating process specification such as a configuration of plating layers to be formed and presence and absence of a plating layer in a top surface, a back surface and side surfaces of a metal plate, the number of forming resist masks can be reduced and a process can be simplified, thereby reducing the cost.

Moreover, a lead frame and a method of manufacturing the lead frame of the present disclosure is useful in the field of including an etching process on a metal plate and being required to form a desired plating layer on each of a top surface and a back surface of the metal plate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A lead frame comprising:
a plurality of leads including inner leads and outer leads, each of the plurality of leads including an inner lead and an outer lead that continuously extend;
a tie bar extending so as to cross connecting points of the inner leads and the outer leads, the leads and the tie bar including a first surface, a second surface opposite to the first surface, and side surfaces provided between the first surface and the second surface;
a plating layer partially and continuously provided on the inner lead, the outer lead and the tie bar;
a first non-plating region provided between an edge in the first surface of the inner lead and an edge of the plating layer provided on the first surface of the inner lead such that the first surface of the inner lead is exposed; and
a second non-plating region provided between an edge of the first surface on the inner lead side of the tie bar and an edge on the inner lead side of the plating layer provided on the first surface of the tie bar such that the first surface on the inner lead side of the tie bar is exposed.

2. The lead frame as claimed in claim 1, wherein the plating layer and the first non-plating region and the second no-plating region is further provided on the second surface.

3. The lead frame as claimed in claim 1, wherein the plating layer is not provided on the side surfaces of the inner lead and the side surfaces of the tie bar.

4. The lead frame as claimed in claim 1, wherein the plating layer is provided on all of the first surface, the second surface and the side surfaces of the outer lead.

5. The lead frame as claimed in claim 2, further comprising:
a third non-plating region that is continued from the first non-plating region and is not covered with the plating layer, provided in a tip region of the inner lead.

6. The lead frame as claimed in claim 5, further comprising:
a second plating layer provided in the third non-plating region on one of the first surface and the second surface, the second plating layer being not connected to the plating layer.

* * * * *